United States Patent [19]
Said

[11] Patent Number: 4,870,593
[45] Date of Patent: Sep. 26, 1989

[54] CIRCUIT AND METHOD FOR DETERMINING THE PHASE ANGLE OF A COMPLEX ELECTRICAL SIGNAL

[75] Inventor: Ahmed M. F. Said, Beaverton, Oreg.

[73] Assignee: Tektronix, Inc., Beaverton, Oreg.

[21] Appl. No.: 179,449

[22] Filed: Apr. 8, 1988

[51] Int. Cl.$^4$ .................. G06F 15/20; G01R 29/02
[52] U.S. Cl. ............................ 364/481; 324/77 B; 324/83 R; 364/485
[58] Field of Search ............ 324/83 R, 86, 77 B; 364/480–483, 485, 729

[56] References Cited

U.S. PATENT DOCUMENTS

| | | | |
|---|---|---|---|
| 3,813,528 | 5/1974 | Blanding | 364/729 |
| 3,956,623 | 5/1976 | Clark et al. | 364/729 |
| 4,031,462 | 6/1977 | Bouvier et al. | 364/485 |
| 4,164,022 | 8/1979 | Rattlingourd et al. | 364/729 |
| 4,644,268 | 2/1987 | Malka et al. | 324/77 B |
| 4,710,892 | 12/1987 | Fling | 364/729 |

Primary Examiner—Parshotam S. Lall
Assistant Examiner—Kevin J. Teska
Attorney, Agent, or Firm—Boulden G. Griffith

[57] ABSTRACT

Methods and circuits for implementing them determine the phase angle of a complex electrical signal from the in-phase and quadrature components of the signal by truncating the magnitudes of the real and imaginary components of the signal and combining them to form an address which is then used to access a lookup table containing angular values. However, if both of the values are small, before they are truncated they are both expressed in terms of a lowest common exponent, i.e., shifted left as much as possible without affecting their ratio. The phase angle from −180 to +180 degrees may be found directly from the lookup table, or, in an alternative variation on the method, a single-quadrant angle is looked up in a shorter table and then supplemented according to quadrant information contained in the signs of the values to produce the total phase angle. Circuits are disclosed for implementing both methods for inputs in 2's complement or sign and magnitude form.

14 Claims, 5 Drawing Sheets

CIRCUIT AND METHOD FOR DETERMINING THE PHASE ANGLE OF A COMPLEX ELECTRICAL SIGNAL

BACKGROUND OF THE INVENTION

This invention relates to the fields of electronic spectrum analysis and methods and circuits used to perform calculations and approximations of trigonometric functions, and more particularly to methods and circuits for determining the phase angle of a complex electrical signal in a spectrum analysis instrument.

A spectrum analyzer is an electronic instrument for providing a frequency domain view of an electrical signal. In a digital spectrum analyzer, a series of amplitude measurements of the signal under analysis are made over time and the values measured are converted to digital words. This stream of digital words representing amplitude values of the signal over a series of times is information in the time domain. A Fourier transform of this time domain information produces a frequency domain description of the same information. This frequency domain description of the electronic signal under analysis can be displayed to an operator as a graph of power amplitude versus frequency, allowing the operator to analyze the signal's spectral content.

In a digital spectrum analyzer continuously monitoring a wideband spectrum, a large number of phase angle calculations must be performed very rapidly. When a complex electrical signal has been characterized by a pair of data sets representing the in-phase and quadrature components of that signal over time, the phase angle of the signal as a function of time may be calculated by taking the arctangent of the quotient of the two values that describe the signal at each point:

$$\text{phase}(t) = \arctan[y(t)/x(t)],$$

where $x(t)$ is the in-phase component of the signal, and $y(t)$ is the quadrature component of the signal.

However, in a digital computer, division is a rather cumbersome and time consuming operation which it is desirable to avoid if alternative methods are available. Similarly, known techniques for taking the arctangent of a quantity also involve cumbersome calculations or lookups from an extensive table or a combination of lookups and interpolation calculations. What is desired is a method for simplifying the determination of phase angle, so that many of these determinations can be accomplished quickly enough to provide realtime phase information for a high speed digital spectrum analyzer monitoring a wide bandwidth continuously.

SUMMARY OF THE INVENTION

The present invention is a method, and circuitry to implement it, for rapidly determining the phase angle of a complex electrical signal from the in-phase and quadrature components of the signal. The values of the real and imaginary components of the signal are truncated and combined to form an address which is then used to access a lookup table containing angular values. However, if both of the values are small, before they are truncated they both are expressed in terms of a lowest common exponent, i.e., shifted left as much as possible without affecting their ratio, so as to maximize the efficiency and accuracy of the lookup process.

In one variation on the method, the values including their signs are used to access a table of angular values from $-180$ to $+180$ degrees. In another variation on the method, the signs of the components of the signal are used to determine which quadrant the signal is in, so that an angle from 0 to 90 degrees, found by accessing a shorter lookup table, can be supplemented appropriately to produce the total phase angle of the signal.

Circuits for implementing both variations on the method include parallel shifters and memories connected so that the shifted and truncated outputs of the parallel shifters access the lookup table in one of the memories, while the other memory acts as a shifter controller, determining the maximum amount that both values can be shifted without altering their ratio. One circuit uses less memory for a lookup table that only contains angular values from 0 to 90 degrees, but requires additional circuit elements to supplement that angle with quadrant information.

In versions of the circuit designed to accept input values in 2's complement form, additional circuitry is included to convert the truncated values to sign and magnitude form. The magnitude portion of the output of this conversion circuitry is then used to form the lookup table address, while the sign bits are used as input to the angle supplementing circuitry.

DETAILED DESCRIPTION

Figure 1:
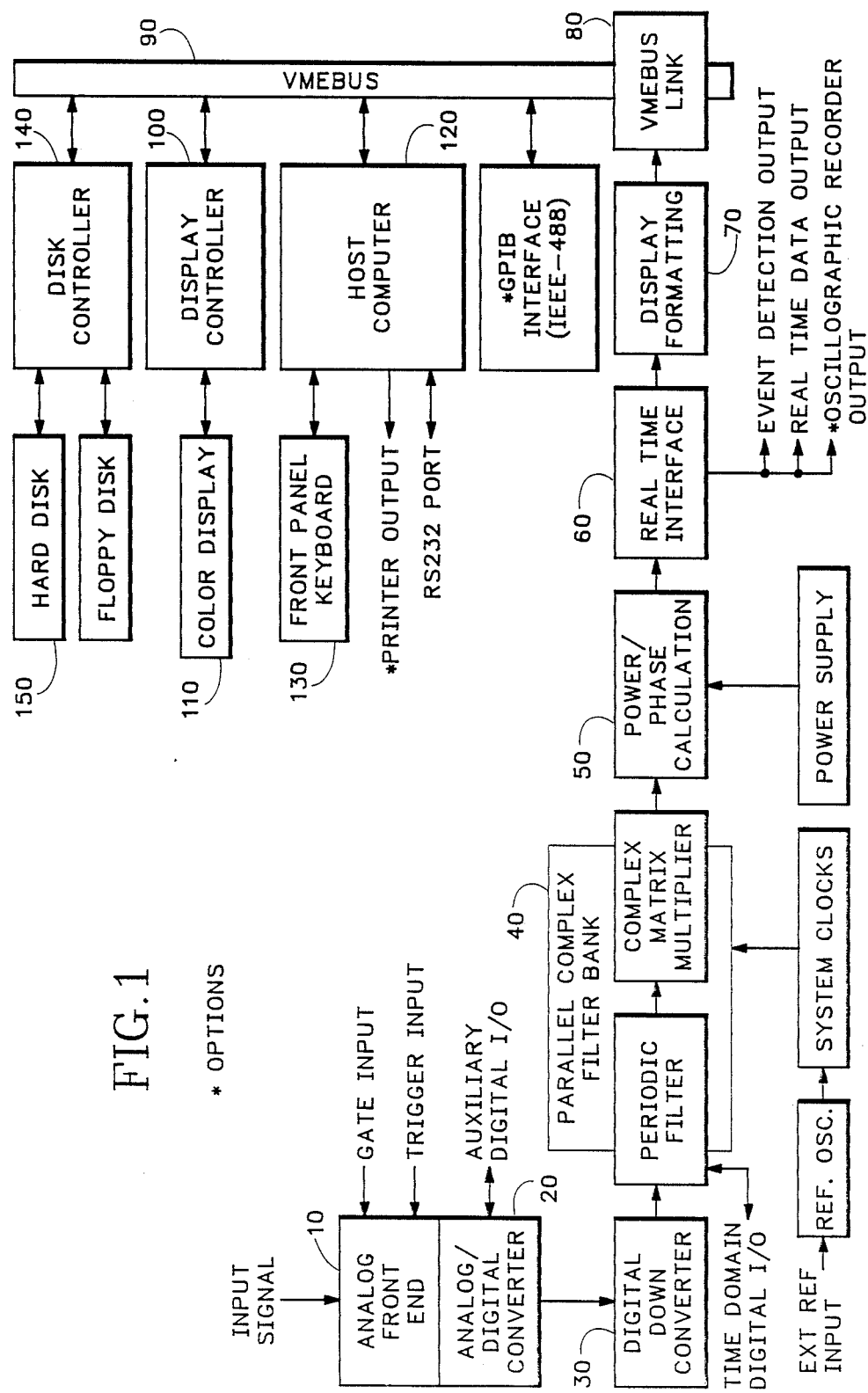
FIG. 1 is a block diagram of an electronic spectrum analyzer embodying the invention.

Referring to FIG. 1, a spectrum analyzer is shown connected to a host computer 120 and color display 110 over a standard VME bus 90 through VME bus link 80 and display controller 100. Electrical signal inputs are amplified or attenuated as appropriate by Analog Front End 10 for digital sampling by A/D Converter 20. Digital Down Converter 30 shifts the 10 MHz input bandwidth down by a selectable frequency between 500 Hz and 9.9995 MHz., then performs a complex low pass filtering process on the resulting complex signal, and provides the filtered output, suitably decimated, to the Parallel Complex Filter Bank 40. The Parallel Complex Filter Bank 40 performs a Fast Fourier Transform on the 5 MHz complex signal, producing the raw spectral data from which the Power/Phase Calculation circuitry 50 can generate meaningful spectral information. The Real Time Interface 60 presents the spectral data to Display Formatting circuitry 70 which organizes it for transmission through the VME Bus Link 80 and VME Bus 90 to the Display Controller 100 and Color Display 110 where it can be monitored by an operator. The operator can store the spectral data on Hard Disk 150 via Disk Controller 140 by controlling operation through the Host Computer 120 from Front Panel Keyboard 130.

In a high speed digital spectrum analyzer of the type shown in FIG. 1, it is necessary for the Power/Phase Calculation circuitry 50 to perform numerous determinations of the phase angle of complex signals expressed as the sum of an in-phase and quadrature components, $x(t)+j^*y(t)$. The instantaneous phase angle can by calculated by taking the arctangent of the quotient of the real and imaginary parts of the signal at a particular point in time:

$$\text{phase}(t) = \arctan[y(t)/x(t)],$$

However, as has been noted above, division and finding the arctangent function are operations which can be troublesome to perform directly. Consequently, the following methods, which are variations on the same idea, have been developed for use in the Power/Phase Calculation circuitry 50:

Shift, Truncate, 4-Quadrant Lookup Method (2's compl. input):

This method anticipates that the input values of $x(t)$ and $y(t)$ be in 2's complement form and normalized to a maximum value of one minus one least significant bit. It then consists of the following steps:

1. IF the most significant bit of each value is the same as the second most significant bit of the corresponding value, SHIFT both values left one bit. Repeat this step as many times as the most significant bit and the second most significant bit of both values match. This step preserves the ratio between the x and y values, while effectively amplifying them to produce more precise results.

2. Truncate (or round off) the values.

3. Address a table using the two truncated values to obtain an angle from $-180$ to $+180$ degrees.

Shift, Truncate, 1-Quadrant Lookup & Combine Method (2's compl):

This method anticipates that the input values of $x(t)$ and $y(t)$ be in 2's complement fractional form and normalized to a maximum value of one minus one least significant bit. It then consists of the following steps:

1. IF the most significant bit of each value is the same as the second most significant bit of the same value, SHIFT both values left one bit. Repeat this step as many times as the most significant bit and the second most significant bit of both values match. This step preserves the ratio between the x and y values, while effectively amplifying them to produce more precise results.

2. Truncate (or round off) the values.

3. Convert the values from 2's complement fractional form to sign plus magnitude fractional form.

4. Address a table using the magnitude portion of the two truncated values to obtain an angle from 0 to 90 degrees.

5. Supplement the angle according to the sign bits of the values to obtain the total phase angle.

Note on sequence of steps: Because the size of the table of the addressing step depends on the length of the address used, the shifting and truncation steps logically preceed the addressing step. And, because the conversion from 2's complement to sign plus magnitude form takes more hardware resources for longer numbers, in many applications it will be desirable to perform the truncation step before the converting step. Finally, the shifting step must preceed the truncation step so that small fractional values are left shifted and effectively multiplied as much as they can be without altering the ratio between the values before any information is lost in the truncation.

In the supplementing step, the total phase angle ($-180$ to $+180$ degrees) is obtained by combining the looked up angle with quadrant information according to the signs of the $y(t)$ and $x(t)$ values and the following relationships:

| SUPPLEMENTING THE LOOKED UP ANGLE | | |
|---|---|---|
| Sign y(t) | Sign x(t) | TOTAL ANGLE |
| + | + | 0 + angle |
| + | − | 180 − angle |
| − | − | angle − 180 |
| − | + | 0 − angle |

Continuing now with the variations on the basic method:

Shift, Truncate, 4-Quadrant Lookup Method (Sign+Mag. input):

This method anticipates that the input values of $x(t)$ and $y(t)$ be in sign plus magnitude fractional form and normalized to a maximum value of one minus one least significant bit. It then consists of the following steps:

1. IF the most significant bits of the magnitude portions of both values are zeros, SHIFT the magnitude portion of both values left one bit disgarding the prior most significant bit. Repeat this step as many times as the most significant bits of the magnitude portions of both values are zero. (Again, this step preserves the ratio between the x and y values, while effectively amplifying them to produce more precise results.)

2. Truncate (or round off) the values.

3. Address a table using the two truncated values, including their sign bits, to obtain an angle from $-180$ to $+180$ degrees.

Shift, Truncate, 1-Quadrant Lookup & Combine Method (Sign+Mag. input):

This method anticipates that the input values of $x(t)$ and $y(t)$ be in sign plus magnitude fractional form and normalized to a maximum value of one minus one least significant bit. It then consists of the following steps:

1. IF the most significant bits of the magnitude portions of both values are zeros, SHIFT the magnitude portion of both values left one bit disgarding the prior most significant bit. Repeat this step as many times as the most significant bits of the magnitude portions of both values are zero. (Again, this step preserves the ratio between the x and y values, while effectively amplifying them to produce more precise results.)

2. Truncate (or round off) the values.

3. Address a table using the combined magnitude portions of the two truncated values to obtain an angle from 0 to 90 degrees.

4. Supplement the angle according to the sign bits of the values to obtain the total phase angle.

The step of shifting away any leading bits that are merely place-holders can be viewed as multiplication, or, even more generally, as expressing the same value in terms of a different exponent and corresponding mantissa. Viewed this way the shifting step is really a search for the minimum common exponent of the two values, so that their mantissas can be multiplied by the base (two, in the case of binary) as many times as possible without changing the ratio of the two values.

To appreciate the how the combination of the shifting step and the truncation step work together, consider the ratio of two positive 32-bit binary numbers (shown with the sign bit separated from the magnitude bits by a binary point):

| | | |
|---|---|---|
| (1/128) | and | 0.00000010000000000000000000000000 |
| (1/512) | | 0.00000000100000000000000000000000 |

The ratio of these two numbers is 4:1. Division could be performed to get a "4", and then the arctangent of that number could be calculated. To avoid calculating the arctangent function and performing a division, the numbers in the ratio can be used as an address and the arctangent looked up based on the different possible values of the ratio between the two numbers. However, if a table is constructed to be accessed directly by all combinations of these numbers, it is going to be a prohibitively large table. If the 31 bits of magnitude information from each of these values is combined into a single 62 bit address, the corresponding table would have 2 62, or approximately five billion billion, locations.

If these numbers are truncated (or rounded off) directly, too much of one or both quantities can be lost, leading to wildly erroneous results:

| | | |
|---|---|---|
| 0.0000001 | (1/128) | and |
| 0.0000000 | (0/128) | |

This alters the ratio from 4:1 to 1:0, or infinity.

If, however, the conditional shifting procedure described above is followed, both numbers can be shifted left until they appear as:

| | | |
|---|---|---|
| (¼) | and | 0.10000000000000000000000000000000 |
| (1/16) | | 0.00100000000000000000000000000000 |

Now the ratio of 4:1 between these two numbers has been preserved, but they have both been multiplied by two six times, or, alternatively, they can be viewed as having had their base-2 exponent changed by six. Truncating the last eight bits of both numbers now produces:

| | | |
|---|---|---|
| 0.1000000 | (½) | and |
| 0.0010000 | (1/16) | |

Each of these shifted and truncated numbers now contains a single sign bit and seven bits of magnitude information. The ratio of the numbers has been preserved, but using the last seven bits of these two numbers as the basis for an address to a lookup table leads to an address that is fourteen bits long and a table of a much more satisfactory length, 2 14 or approximately sixteen thousand possibilities. This size of table is conveniently (commercially) available and provides sufficient phase angle resolution for most purposes.

With the base angle for the quadrant established by the sign bits, and the exact angle within the quadrant determined by reference to a table addressed by the conditionally shifted and truncated remaining portions of the numbers, combining the base and looked-up angles will produce the desired total phase angle.

The following example shows an analogous procedure being followed with an input that consists of negative numbers in 2's complement form. Suppose the two numbers for y(t) and x(t) are, respectively:

| | |
|---|---|
| (−3/64) | 1.11110100000000000000000000000000 |
| (−7/64) | 1.11100100000000000000000000000000 |

The two negative sign bits will access the quadrant whose base angle is 180°. Our more generalized rule for conditional shifting will result in both numbers being shifted three places to the left. (Since both numbers end in 0's, 0's will be filled in on the right for both numbers, but this does not matter because these bits will usually be truncated or rounded off anyway.) Before these numbers are shifted, they have the ratio of 3:7. After the numbers are shifted, they are:

| | |
|---|---|
| (−⅜) | 1.10100000000000000000000000000000 |
| (−⅞) | 1.00100000000000000000000000000000 |

And, the ratio of 3:7 is preserved. The next step in the process is to truncate these numbers to the length required for addressing the lookup table, in our example 8 bits:

| | |
|---|---|
| 1.1010000 | (−⅜) |
| 1.0010000 | (−⅞) |

These truncated numbers are then converted, since they are negative, to their sign and magnitude positive equivalents:

| | |
|---|---|
| 0.0110000 | (⅜) |
| 0.1110000 | (⅞) |

Again, the ratio of 3:7 is preserved, and now they are the positive numbers that are needed to access the table of angles between 0 and 90 degrees. While some information is lost by this truncation (or rounding off) step, the conditional shifting step has ensured that the most significant bits are occupied by meaningful numbers that adequately describe the ratio of the two values. If the conditions for shifting are not satisfied, the numbers in the most significant bit locations are already meaningful.

To continue the example, the two magnitude portions of the values are now combined to form an address, an address which in this case is 14 bits long:

01100001110000

This address is then used to access a lookup table of a length, 16,384, corresponding to the length of this address work. The width of the word stored in this table may vary, but 16 bits is a very suitable width for a table of 16k length. Depending on the application, less precision might suffice. For most applications, however, one wishes to have sufficient precision in the output of the table so that little or nothing is contributed to the total error of the result by any imprecision of the table.

For cases where the values of x(t) and y(t) happen to be perfectly accurate representations of the signal, 16 bits of table width will allow the angular value to be read out of the table with a precision of four decimal places, of which two are to the left of the decimal point and two are to the right of it. Representing the integer portion of the angular values from 0 to 90 degrees requires 7 bits of the available 16, leaving 9 bits to represent the fractional portion of the angular value. The 9 bits are 1 bit short of being able to accurately convey three decimal places of fractional angular value, and are more than enough to give precise values in the second fractional decimal place for readouts in the form of: XX.XX.

For those cases where the values of x(t) and y(t) do not happen to be perfectly accurate representations of the signal, and may be off by one least significant bit, the accuracy of the readout is controlled by these errors in x(t) and y(t) rather than by the precision available from the length of the table. The smallest error in the angular output which will arise from a single bit difference in the value of x(t) and y(t) can be calculated. It occurs when one of the values is maximum, that is one minus one least significant bit (1—lsb), and the other is one least significant bit, 1/128. For this condition, the least change in output angle will be approximately equal to $6.25 \times 10^{-5}$, which is approximately equal to $2^{-14}$ or plus or minus one in the $2^{-15}$ place. This indicates that for all cases the inaccuracy in x(t) and y(t) will be more significant than the imprecision of the output of a 16-bit table.

Errors can occur in a special case that only arises for one of the four variations on the basic method described above. In the case of the 2's complement version of the single quadrant lookup and combine variation on the method, there is a step of converting the conditionally shifted values from 2's complement to sign plus magnitude form. If one or both of the values for x(t) or y(t) are negative and equal to an integral (negative) power of two, such as 1.111110000000000 (−1/32) or 1.111111111110000 (−1/2048), the method described above encounters a problem in the step of converting the negative 2's complement number to a sign plus magnitude number if this is accomplished by taking the 2's complement of the 2's complement number.

For some applications it is acceptable to ignore this problem, since it occurs only a small percentage of the time. For an input length of N bits, this case arises only N−1 times out of $2^N$ possible input values. In other applications, where this problem cannot be ignored, a means for identifying this special case can be used to watch for it and it can then be handled with an exception process. Such an exception process might consist of adding a single least significant bit when this case is detected. Alternatively, one less shift can be performed for all cases, thereby avoiding the problem. But this approach results in a loss of resolution in the table lookup step.

Figure 2A:
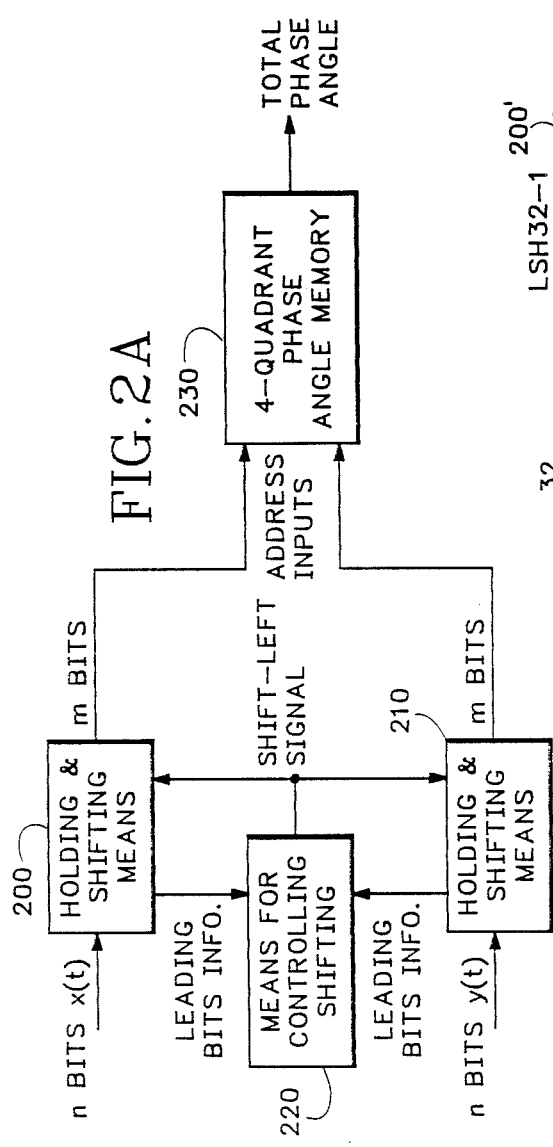
FIG. 2A is a block diagram of a circuit for performing the shift, truncate, 4-quadrant lookup method on 2's complement input values.
Figure 2B:
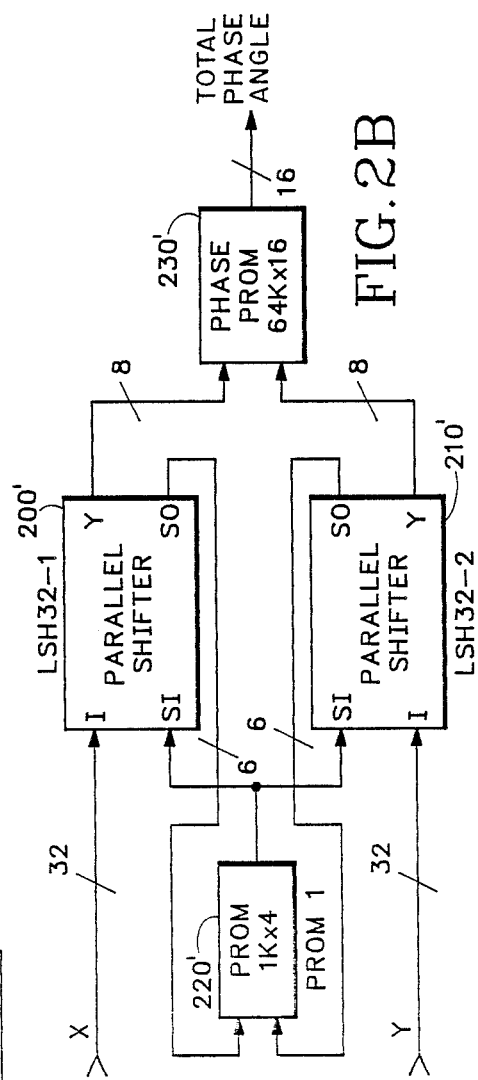
FIG. 2B is a block diagram of a particular circuit for performing the shift, truncate, four-quadrant lookup method on 2's complement input values.

Referring now to FIGS. 2A and 2B, circuitry is shown for implementing the Shift, Truncate, 4-Quadrant Lookup Method with 2's complement inputs. FIG. 2A shows a generalized block diagram of a circuit to implement this variation on the method, while FIG. 2B shows a more specific implementation.

FIG. 2A shows n-bit inputs of x(t) and y(t) being applied to the input of two means for holding and shifting 200, 210. The means for holding and shifting 200, 210 produce leading bits information for input to means for controlling shifting 220. The means for controlling shifting 220 compares the leading bits information from the two holding and shifting means 200, 210 and produces shift-left signals that implement the algorithms of the conditional shifting steps of the methods described above. The most significant m bits of the shifted x(t) and y(t) values contained in the holding and shifting means 200, 210 are output by those circuits and connected as address inputs to the 4-quadrant phase angle memory 230, which produces the desired total phase angle at its output.

In the more specific implementation shown in FIG. 2B, the number of input bits is 32, and the means for holding and shifting are parallel shifters 200', 210'. The SO outputs of the parallel shifters 200', 210' are the leading bits information in the form of a binary number representing the number of leading bits that are identical in the value of x(t) or y(t). This number is also the exponent of the value expressed in exponent and mantissa form. The 1K×4 PROM 220' provides the means for controlling shifting, providing a number on its output that tells the parallel shifters 200, 210 how many times both values can be shifted without changing their ratio. These four bits of shift-left information are applied to the SI inputs of the parallel shifters 200', 210' to inform them of the amount of left shifting desired.

The conditions for causing a shift to occur can be controlled by altering the contents of the PROM 220', but in this implementation the parallel shifters 200', 210' will be directed to shift both values until they are both expressed in terms of their smallest common exponent (largest common negative exponent). That is, the contents of the PROM 220' correspond to the conditional shifting algorithm described above: "If the most significant bit of each value is the same as the second most significant bit of the corresponding value, shift both values left one bit. Repeat this step as many times as the most significant bit and the second most significant bit of both values match."

The algorithm of the conditional shifting step is stated as a sequential process logically, but it can be seen from the specific implementation shown in FIG. 2B and described above that the actual hardware can ascertain the number of leading bits that match and generate shifting instructions to accomplish the desired shifting in a process that is substantially parallel, thereby saving time.

After the shifting is completed, the shifted and truncated values of x(t) and y(t) are the outputs of holding and shifting means 200, 210. These are connected as address inputs to the 4-quadrant phase angle memory 230, where they will access the desired phase angle stored in that memory.

The Y outputs of the parallel shifters 200', 210' shown in FIG. 2B are the most significant bits of the shifted value. When these two 8-bit truncated values are combined to form an address, they are 16 bits wide and address a memory space of 64K. In the more generalized case shown in FIG. 2A, the memory 230 is of a length appropriate to an address length of 2×m. In the more specific version of the circuit shown in FIG. 2B, m is 8 bits, 2m is 16 bits, and the length of the phase PROM 230' is 64K. Each of the 8-bit truncated 2's complement values includes one bit which is effectively a sign bit, so that the two 8-bit values including sign information are the logical equivalent of two 7-bit values without sign information, in that the 64K table they address has the same information as the 16K table described above, but duplicated four times, once for each quadrant. The length of the phase PROM memory 230' is 16 bits, which, as it was shown above, is a suitable length for providing sufficient precision in the output of the lookup table.

Figure 3A:
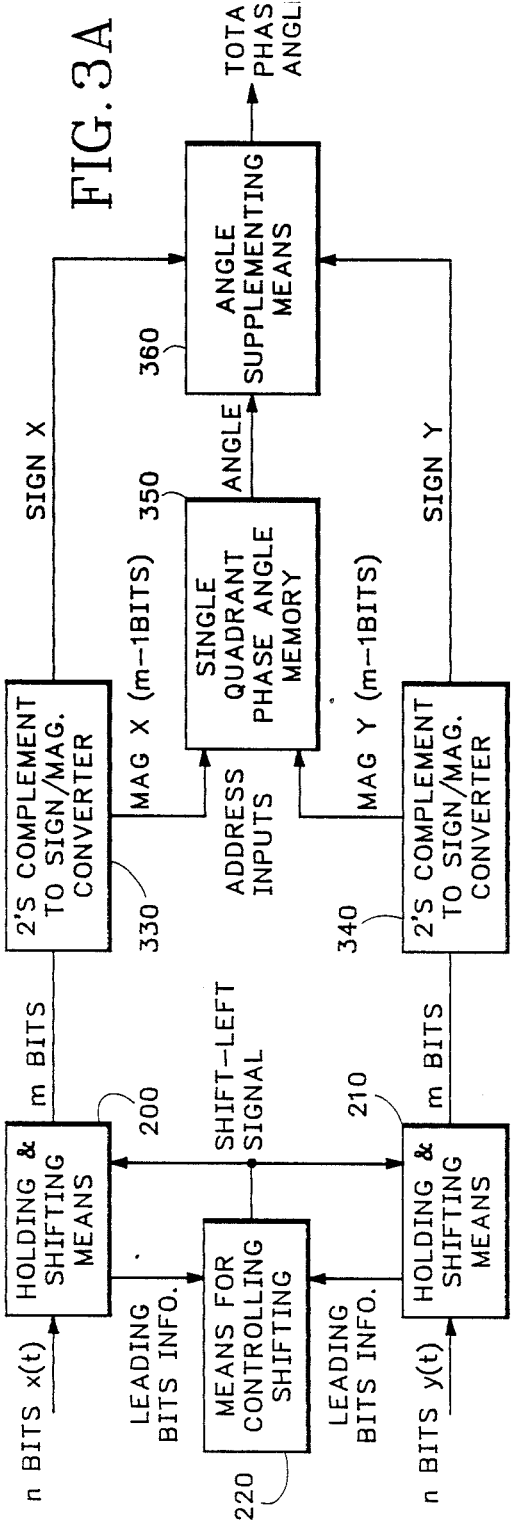
FIG. 3A is a block diagram of a circuit for performing the shift, truncate, single-quadrant lookup and combine method on 2's complement input values.

Referring now to FIG. 3A, in the single quadrant lookup and combine version of this circuit, again with 2's complement inputs, the holding and shifting means 200, 210, the means for controlling shifting 220, and their interconnection, are identical to their counterparts in the 4-quadrant version shown in FIG. 2A and described above. However, in this single-quadrant version, instead of the m-bit (truncated) outputs of the holding and shifting means 200, 210 being applied directly to a lookup memory, these 2's complement values are inputs to a pair of 2's complement to sign/magnitude converter circuits 330, 340 which perform that function, producing sign and magnitude outputs for both values.

The magnitude outputs of the 2's complement to sign/magnitude converters 330, 340, which are m-1 bits in length, are connected as address inputs to a single-quadrant phase angle memory 350 which produces an angle from 0 to 90 degrees in response to their input. This angle and the sign bit outputs of the 2's complement to sign/magnitude converters 330, 340 are inputs to a angle supplementing means 360, which produces the resulting total phase angle at its output.

Figure 3B:
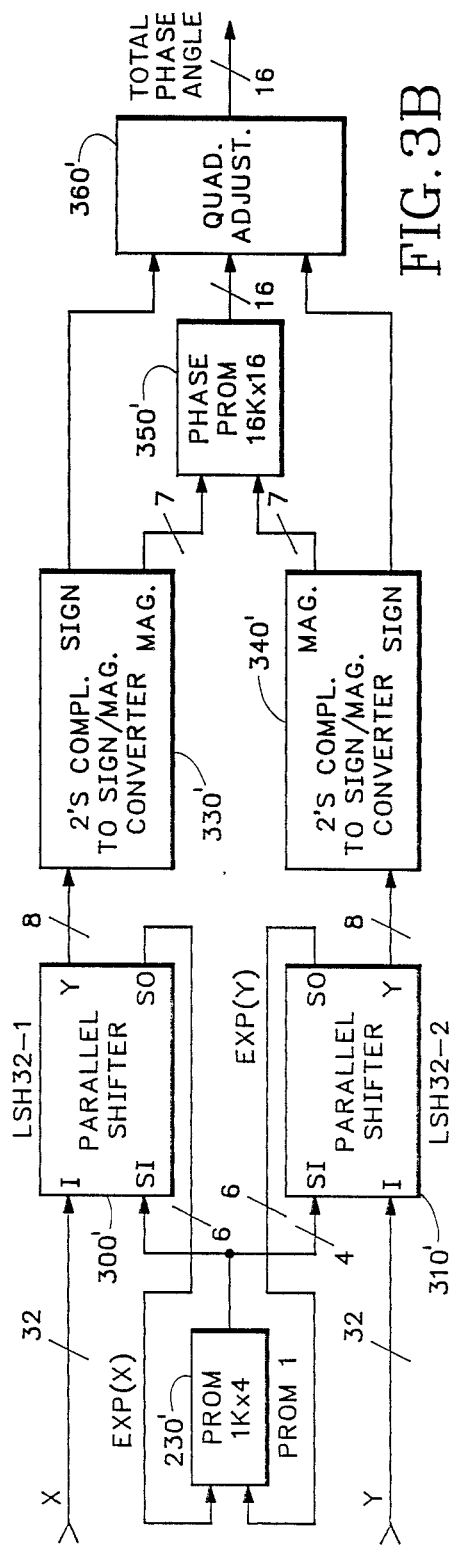
FIG. 3B is a block diagram of a particular circuit for performing the shift, truncate, single-quadrant lookup and combine method on 2's complement input values.

Referring now to FIG. 3B, a more specific implementation shows the single quadrant phase angle memory to be a 16K—16 bit phase PROM 350'.

Figure 4:
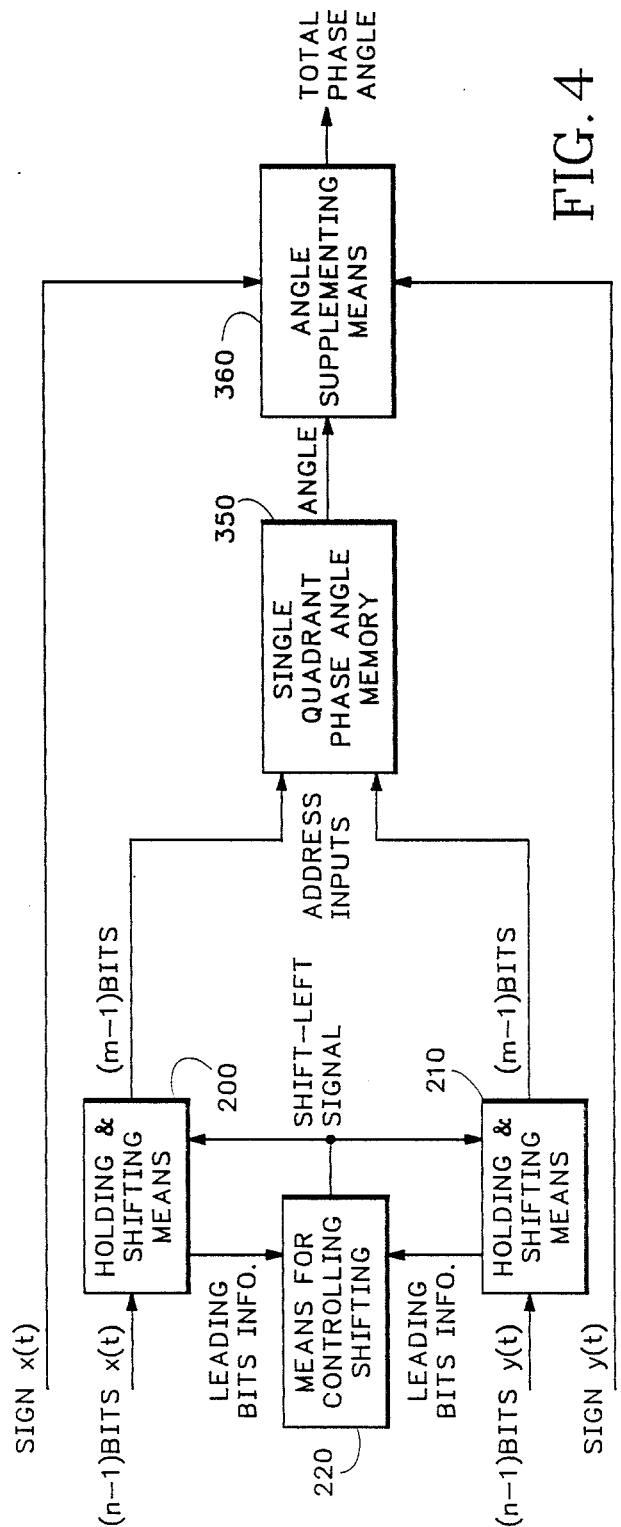
FIG. 4 is a block diagram of a circuit for performing the shift, truncate, single-quadrant lookup and supplement method on input values expressed in sign and magnitude form.

Referring next to FIG. 4, a similar approach provides a circuit for implementing the single-quadrant lookup and combine variation on the method. This circuit is quite similar to the one shown in FIG. 3A, except that, because the input is now already in sign and magnitude form, the holding and shifting means 200, 210 operate only on the magnitude part of the values and no 2's complement to sign/magnitude conversion is required since the sign bit is already available for direct connection to the quadrant and angle combining means 360.

Figure 5:
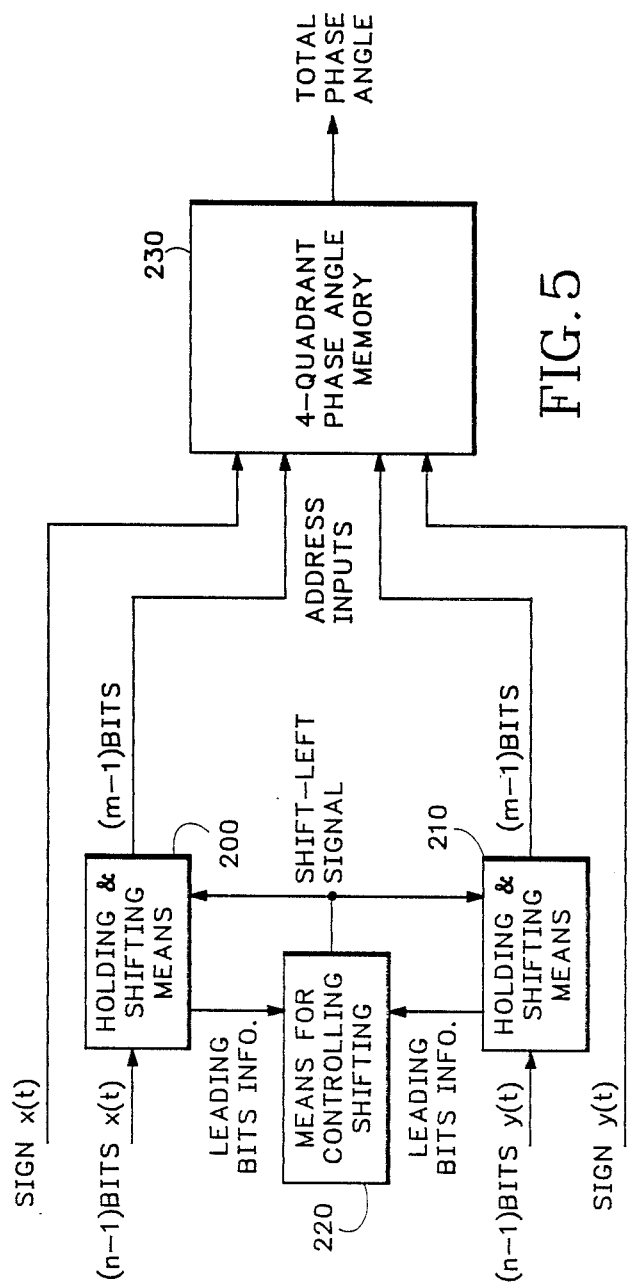
FIG. 5 is a block diagram of a circuit for performing the shift, truncate, four-quadrant lookup method on input values expressed in sign and magnitude form.

Referring next to FIG. 5, a circuit for performing the 4-quadrant lookup method on sign and magnitude inputs resembles the circuit in FIG. 2A, except that, instead of the sign information being implicit in the m-bits of output from the holding and shifting means 200, 210 it is directly connected to the 4-quadrant phase angle memory address inputs, and the holding and shifting means 200, 210 operate on one less bit of magnitude-only information.

And, for both of these circuits that use sign plus magnitude inputs, the shifting step is performed as many times as the most significant bit of the magnitude portion of both values are zeros.

I claim:

1. A method for determining the instantaneous phase angle of a complex electronic signal described by two components, comprising the steps of:
   expressing a value of both components in terms of a lowest common exponent and resulting mantissas;
   truncating the mantissas of the values;
   forming an address from the truncated mantissas of both values; and
   finding the phase angle by addressing a lookup table with the address.

2. A method as recited in claim 1 wherein the component values each comprise sign and magnitude portions, the expressing and truncating steps operating on the magnitude portions and the address being formed from the sign portions as well as from the truncated magnitude portion of both values.

3. A method as recited in claim 1 wherein the component values each comprise sign and magnitude portions, the expressing and truncating steps operating on the magnitude portions and the finding step comprises the steps of:
   looking up a single quadrant angle by addressing a lookup table with the address; and
   supplementing the single quadrant angle according to the signs of the two values to obtain the phase angle of the signal.

4. A method as recited in claim 1 wherein the component values are in 2's complement fractional form and the forming step is preceeded by a step of converting the truncated 2's complement values to sign and magnitude portions, and the forming step operates on the truncated mantissas of the magnitude portions of the values, and wherein the finding step comprises the steps of:
   looking up a single quadrant angle by addressing a lookup table with the address; and
   supplementing the single quadrant angle according to the signs of the two values to obtain the phase angle of the signal.

5. A method as recited in claim 1 wherein the values are in 2's complement fractional form and the expressing step comprises left shifting the values until the most significant bit and the second most significant bit are not the same.

6. A method as recited in claim 1 wherein the values are in sign and magnitude form, and the expressing step comprises left shifting the magnitude portion of the values until the most significant bit is not zero.

7. A method as recited in claim 1 wherein the truncation step comprises rounding off.

8. A circuit for determining phase angle of a complex electrical signal having two components, comprising:
   first means for holding and shifting a binary number, having a binary value input, a shift number input, a leading bits information output, and a truncated value output, with the value of one of the components as the binary value input;
   second means for holding and shifting a binary number, having a binary value input, a shift number input, a leading bits information output, and a truncated value output, with the value of the other component as the binary value input;
   means for controlling shifting, having a first input, a second input, a first output, and a second output, with the leading bits information output of the first means for holding and shifting as the first input, the leading bits information output of the second means for holding and shifting as the second input, the first output applied to the shift number input of the first means for holding and shifting, and the second output applied to the shift number input of the second means for holding and shifting; and means for finding the angle, having an address input and a phase angle output, with the truncated value outputs of the first and second means for holding and shifting supplying the address input and the phase angle of the complex electrical signal as the phase angle output.

9. A circuit as recited in claim 8 wherein the values of the two components, the truncated value output of the first means for holding and shifting, and the truncated value output of the second means for holding and shifting are absolute values and the sign bits associated with the two component values are applied to the address input of the means for finding.

10. A circuit as recited in claim 8 wherein the finding means comprises a single quadrant phase angle memory portion and a quadrant and angle combining portion, the quadrant and angle combining portion having a sign-of-x input and a sign-of-y input, with the two component value inputs to the holding and shifting means being magnitudes only and sign bits associated with these values being applied to the sign-of-x and sign-of-y inputs of the quadrant and angle combining portion of the finding means respectively.

11. A circuit as recited in claim 8 wherein the values of the two components, the truncated value output of the first means for holding and shifting, and the truncated value output of the second means for holding and shifting are in 2's complement fractional form, and the controlling shifting means causes left shifting to occur until the most significant bit and the second most significant bit of one of the values are not equal.

12. A circuit as recited in claim 11 wherein the controlling shifting means and the finding means are programmable read-only memories.

13. A circuit as recited in claim 8 wherein the finding means comprises a single quadrant phase angle memory portion and a quadrant and angle combining portion, the quadrant and angle combining portion having a sign-of-x input and a sign-of-y input, with the two component value inputs to the holding and shifting means, the truncated value output of the first means for holding and shifting, and the truncated value output of the second means for holding and shifting being in 2's complement fractional form, and the controlling shifting means causing left shifting to occur until the most significant bit and the second most significant bit of one of the values are not equal, and wherein the circuit for determining the phase angle further comprises a first and second means for converting a 2's complement number to a sign and magnitude representations, with the first means for converting being disposed between the truncated value output of the first means for holding and shifting and the finding means to receive the truncated value output and provide the corresponding magnitude to the finding means as part of the address input and the corresponding sign bit to the sign-of-x input of the quadrant and angle combining portion, and with the second means for converting being disposed between the truncated value output of the second means for holding and shifting and the finding means to receive the truncated value output and provide the corresponding magnitude to the finding means as part of the address input and the corresponding sign bit to the sign-of-y input of the quadrant and angle combining portion.

14. A circuit as recited in claim 13 wherein the controlling shifting means and the single quadrant phase angle memory portion of the finding means are programmable read-only memories.

* * * * *